(12) United States Patent
Yoshida et al.

(10) Patent No.: US 7,157,368 B2
(45) Date of Patent: Jan. 2, 2007

(54) METHOD OF ACCELERATING TEST OF SEMICONDUCTOR DEVICE

(75) Inventors: Kenji Yoshida, Kawasaki (JP); Hiroshi Nakazawa, Yokohama (JP); Takeshi Fujimaki, Yokohama (JP); Koji Miyamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 465 days.

(21) Appl. No.: 10/642,222

(22) Filed: Aug. 18, 2003

(65) Prior Publication Data

US 2004/0106219 A1    Jun. 3, 2004

(30) Foreign Application Priority Data

Aug. 19, 2002  (JP) .............................. 2002-238032

(51) Int. Cl.
*H01L 21/4763* (2006.01)
(52) U.S. Cl. ................. 438/626; 257/669; 257/E23.01
(58) Field of Classification Search .................... 438/5, 438/7, 10–11, 14, 16–18, 22–25, 29, 31, 34–36, 438/128–130, 149, 484, 538, 209, 486, 502, 438/616, 622, 660, 689, 672, 690, 720, 754
See application file for complete search history.

(56) References Cited

U.S. PATENT DOCUMENTS 5,930,587 A    7/1999  Ryan 6,348,741 B1 *   2/2002  Ogino et al. ................. 257/782
6,946,723 B1 *   9/2005  Satoh et al. ................. 257/669
2002/0098681 A1 *  7/2002  Hu et al. ..................... 438/626

FOREIGN PATENT DOCUMENTS

JP         3-254126       11/1991
JP         10-12687        1/1998

OTHER PUBLICATIONS

K. Yoshida et al., International Electron Device Meeting, pp. 753-756, "Stress-Induced Voiding Phenomena for an Aactural CMOS LSI Interconnects", Dec. 2002.

* cited by examiner

*Primary Examiner*—Michael Lebentritt
*Assistant Examiner*—Andre' Stevenson
(74) *Attorney, Agent, or Firm*—Oblon, Spivak, McClelland, Maier & Neustadt, P.C.

(57) ABSTRACT

Semiconductor elements composing a semiconductor device are formed on a semiconductor substrate. Wirings composed of copper or an alloy mainly composed of copper are formed in wiring layers through interlayer insulation films to connect the semiconductor elements to each other. When the wirings are formed, a temperature of the wirings is held in a first temperature zone covering ±40° C. of a temperature at which a stress migration is most accelerated.

8 Claims, 13 Drawing Sheets

METHOD OF ACCELERATING TEST OF SEMICONDUCTOR DEVICE

CROSS REFERENCE TO RELATED APPLICATIONS

This application is based upon and claims the benefit or priority from the prior Japanese Patent Application No. P2002-238032, filed on Aug. 19, 2002; the entire contents of which are incoporated herein by reference.

BACKGROUND OF THE INVENTION

1. Field of the Invention

The present invention relates to a semiconductor device testing method and a semiconductor device manufacturing method. In particular, the present invention relates to a testing method by which a semiconductor device is screened for failure and a semiconductor device manufacturing method including a screening process.

2. Description of the Related Art

One of the main features of semiconductor devices is high reliability, which cannot be obtained in other electronic devices. The high reliability of the semiconductor devices can be achieved by screening for eliminating semiconductor devices having a high failure rate. An acceleration test has been generally executed to test semiconductor devices that have been screened for a short period of time. In the acceleration test, the operation of a mechanism is accelerated in an operational condition that is more strict than an ordinary operational condition, and the semiconductor devices are screened based on the effects of the accelerated operation of the mechanism.

The semiconductor device acceleration test checks for semiconductor devices having the potential to fail the test by applying thermal stress, electrical stress, and the like thereto and eliminates the semiconductor devices with potential for failure. The semiconductor devices with a potential to fail have various reasons for failure. Further, a wide variety of failure modes are observed when the semiconductor devices are checked. Thus, various acceleration tests are employed according to the failure modes.

Among the acceleration tests, burn-in testing, which has a purpose of detecting and eliminating a failed gate oxide film, is known as the most effective acceleration test. In the burn-in testing, a semiconductor device is placed in an atmosphere of 100° C. to 150° C., and an electric field, which is as large as or twice as large as an actually used electric field, is applied to the semiconductor device. In the burn-in testing, the semiconductor device is held for a predetermined period of time in s stand-by state or in a dynamic state. The time to failure of the gate oxide film is ordinarily proportional to the minus one power of an electric field applied thereto. Therefore, the burn-in testing can effectively accelerate the time to failure of the gate oxide film. As a result, the burn-in testing is effective as an acceleration test of the gate oxide film.

In contrast, a wiring step in a semiconductor device manufacturing process has many factors for causing failure. Wiring breakage caused by using copper as a wiring material is one of the factors for causing failure. A failure mode called stress migration is widely known by which wirings are broken in a high temperature cycle or when they are left in a high temperatur environment. In stress migration, voids are created in the wirings by the stress applied to a wiring pattern by the difference of thermal expansion factors between the wirings and interlayer insulation films or by external heat. The voids grow and break the wirings. Since the time to failure of the stress migration has no relation to the electric field applied to semiconductor devices, it cannot be screened by the burn-in testing. Accordingly, the breaking failure of semiconductor devices cannot be eliminated before they are shipped, thereby the reliability of the semiconductor devices is decreased.

SUMMARY OF THE INVENTION

An aspect of the present invention inheres in a testing method for a semiconductor device having wirings composed of copper or an alloy mainly composed of copper according to embodiments of the present invention includes executing an acceleration test for eliminating an initial failure of the wirings due to stress migration.

Another aspect of the present invention inheres in a manufacturing method for a semiconductor device according to embodiments of the present invention includes forming semiconductor elements composing the semiconductor device on a semiconductor substrate; and forming wirings composed of copper or an alloy mainly composed of copper in wiring layers through interlayer insulation films to connect the semiconductor elements to each other, wherein the forming of the wirings comprises holding a temperature of the wirings in a first temperature zone covering ±40° C. of a temperature at which a stress migration is most accelerated.

Still another aspect of the present invention inheres in a manufacturing method for a semiconductor device according to embodiments of the present invention includes forming semiconductor elements composing the semiconductor device on a semiconductor substrate; and forming wirings composed of copper or an alloy mainly composed of copper in wiring layers through interlayer insulation films to connect the semiconductor elements to each other, wherein the forming of the wirings comprises increasing and decreasing the temperature of the semiconductor device in a second temperature zone covering ±40° C. of a reference temperature set in a first temperature zone covering ±40° C. of a temperature at which the stress migration is most accelerated.

DETAILED DESCRIPTION OF THE INVENTION

Figure 1:
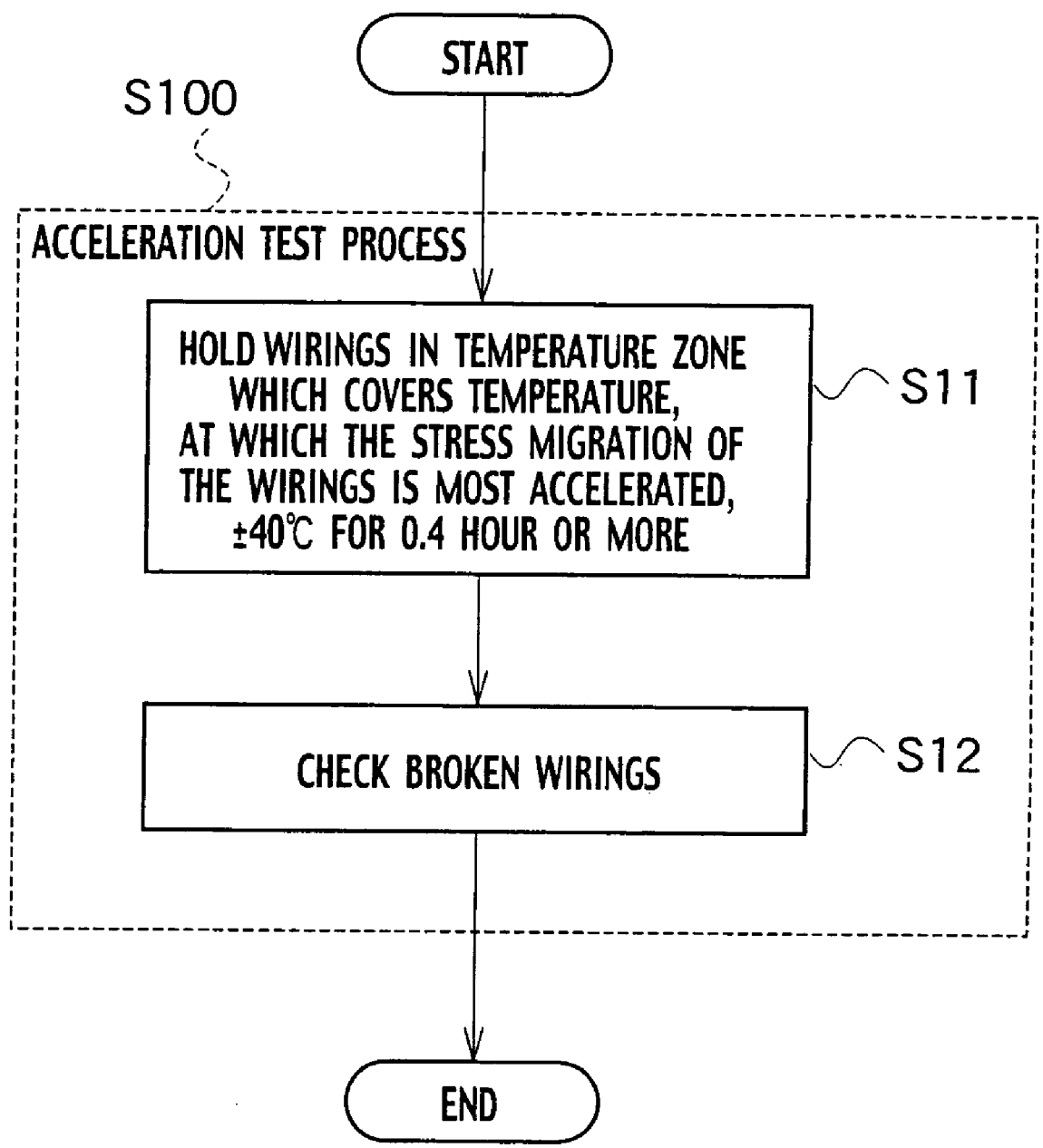
FIG. 1 is a flowchart of an acceleration test process S100 included in a semiconductor device testing method according to a first embodiment.

Various embodimets of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

In a semiconductor device testing method according to a first embodiment of the present invention, a semiconductor device acceleration test process S100 is executed. The acceleration test process S100 is executed on a semiconductor device having wirings (hereinafter, referred to as "Cu wiring") composed of copper (Cu) or an alloy mainly composed of Cu. The acceleration test process S100 eliminates the initial failure of the Cu wiring which may occurr in the semiconductor device.

As shown in FIG. 1, in the acceleration test process S100, first, the temperature of the semiconductor device is set to a temperature within the temperature zone that covers a temperature at which the stress migration of the Cu wiring is most accelerated, that is, 190° C.±40° C. for 0.4 hour or more at step S11. Next, at step S12, the breakage failure of the Cu wiring is checked. The acceleration test process S100 will be specifically described below.

(a) At step S11, first, the temperature of the semiconductor device is increased from room temperature to the temperature zone that covers the temperature at which the stress migration of the Cu wiring is most accelerated, that is, 190° C.±40° C. Hereafter, the temperature at which the stress migration of the Cu wiring is most accelerated is called a "most accelerated temperature". As described below this temperature is apprexmately 190° C. Note that a speed of temperature increase and a method of increasing temperature are not particularly limited, and the semiconductor device is heated by means similar to that of an ordinary high-temperature test in screening.

(b) Next, the semiconductor device is left in the temperature zone that covers the most accelerated temperature ±40° C. for 0.4 hours or more. While the semiconductor device is being heated, no electric or mechanical stress is applied to the semiconductor device. The temperature zone that covers the most accelerated temperature ±40° C. and the hold time (0.4 hour or more) will be described later.

(c) Next, the temperature of the semiconductor device is decreased from the temperature zone that covers the most accelerated temperature ±40° C. to the room temperature. The speed of temperature decrease speed and a method of temperature decrease are not particularly limited, and the semiconductor device is cooled by means similar to that of an ordinary high-temperature holding test in the screening.

(d) Finally, at step S12, whether or not the Cu wiring are broken is checked. The acceleration test process S100 is finished through the above procedure.

Next, the temperature zone that covers the most accelerated temperature ±40° C. and the holding time of at least 0.4 hour will be described with reference to FIGS. 2 to 6.

Figure 2:
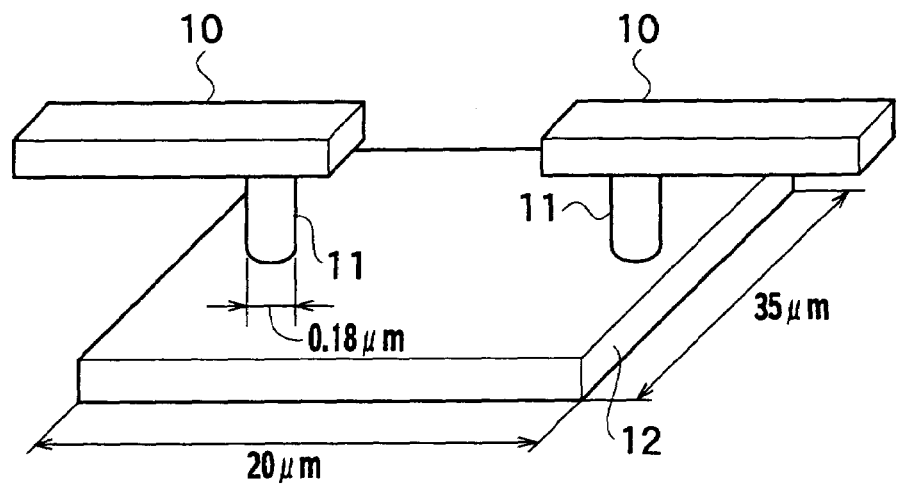
FIG. 2 is a perspective view of a via contact chain used in an experiment of acceleration of the stress migration of Cu wiring executed by the inventors of the present invention.

The acceleration of the stress migration of the Cu wiring can be evaluated using a via contact chain composed of Cu wiring as shown in FIG. 2. The via contact chain of FIG. 2 has, for example, a lower layer Cu wiring 12, via contacts 11, and upper Cu wiring 10. The lower Cu wiring 12 is formed in a rectangular shape of 35 μm×20 μm. Each via contact 11 is formed in a column shape of 0.18 μm dia, connected to the main surface of the lower Cu wiring 12, and is composed of Cu. The upper layer wirings 10 is connected to the via contacts 11. The via contact chain shown in FIG. 2 is a part of an arrangement of via contact chains. While not shown in FIG. 2, the upper layer wirings 10 is further connected to other lower Cu wiring adjacent thereto through via contacts. That is, in the via contact chains, the lower Cu wiring 12 is connected to the upper layer wirings 10 alternately and repeatedly through the via contacts 11.

Figure 3:
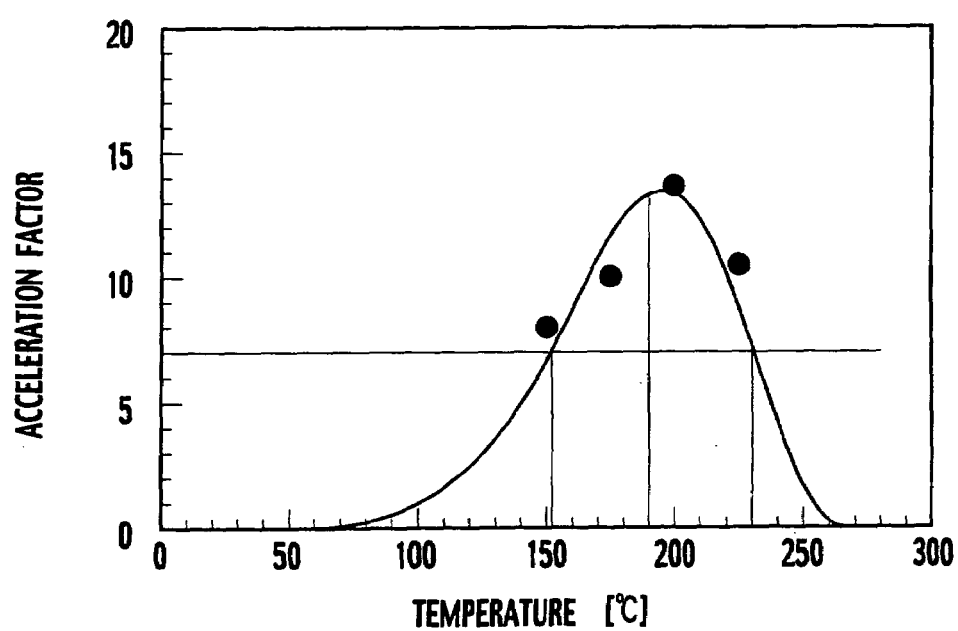
FIG. 3 is a graph showing the relationship between the acceleration factor of stress migration in the via contact chain shown in FIG. 2 and a test temperature.

In FIG. 3, a lateral axis shows a semiconductor device test temperature and a vertical axis shows an acceleration factor of stress migration in the acceleration test process S100. The acceleration factor shows an accelerated rate of stress migration whose speed is accelerated by the acceleration test process with respect to the processing speed of the stress migration in an ordinary use or operation condition, which is set to 100° C. In FIG. 3, the acceleration of the stress migration of the Cu wiring is shown by an acceleration factor AF. The acceleration factor AF in FIG. 3 shows acceleration to the time to failure due to stress migration in the environment of 100° C. that is the maximum temperature at which semiconductor devices are actually used. The time to failure of Cu wiring due to stress migration depends of an environment temperature Ta and has a relationship shown by Expression 1.

$$(\text{Time to failure}) = C(T0-Ta)^{-n} \cdot \exp(Ea/kTa) \quad (1)$$

The acceleration factor AF is a ratio of a time to failure at 100° C., that is the maximum temperature Ta in actual use of semiconductor devices, to a time to failure at a semiconductor device test temperature Tatest of semiconductor devices in the acceleration test process and has a relationship shown by Expression 2.

$$AF = \{C(T0-Ta)^{-n} \cdot \exp(Ea/kTa)\} / \{C(T0-\text{Tatest})^{-n} \cdot \exp(Ea/k\text{Tatest})\} \quad (2)$$

where, C and n are constants inherent to a semiconductor device, T0 is a stress free temperature, Ea is activation energy of the growth of voids in wirings, and k is the Boltzmann constant. The term of $(T0-\text{Tatest})^{-n}$ is a reciprocal number term of avoid creation frequency. A higher test temperature Tatest results in a lower frequency of void creation. The term $\exp(Ea/k\text{Tatest})$ is a reciprocal number term of a void growth speed. A higher test temperature Tatest results in a faster void growth speed. From what has been described above, it can be understood that the acceleration factor AF has a maximum value. As to the via contact chain shown in FIG. 2, the acceleration factor AF is maximized when a test temperature is at 190° C. The stress migration of the Cu wiring is most accelerated when acceleration factor AF has a maximum value. The test temperature Ta which is obtained when the maximum acceleration factor AF has a maximum value corresponds to the "most accelerated temperature", as previously discussed. In the via contact chain shown in FIG. 2, the most accelerated temperature is 190° C. The acceleration factor AF at the most accelerated temperature is 13.5. Further, it is preferable that the acceleration factor AF in the acceleration test process be 7 or more. To set the acceleration factor AF to 7 or more, the semiconductor device test temperature Ta must be maintained within the range of the most accelerated temperature 190° C.±40° C. as shown in FIG. 3. That is, when the most accelerated temperature is 190° C., it is preferable to execute the acceleration test in the temperature zone of 150° C. to 230° C. However, a maximal value of acceleration is somewhat different according to the design rule of Cu wiring, a film thickness of wirings, the wiring material, and the type of an interlayer insulation film. That is, the most accelerated temperature of a semiconductor device is the most accelerated temperature of a Cu wiring to which a via contact having a minimum diameter is connected in the semiconductor device. The most accelerated temperature is within the range of 150° C. to 230° C. For example, when the most accelerated temperature of a semiconductor device is 150° C., the temperature zone in which the acceleration test is preferably executed ranges from 110° C. to 190° C.

Figure 4:
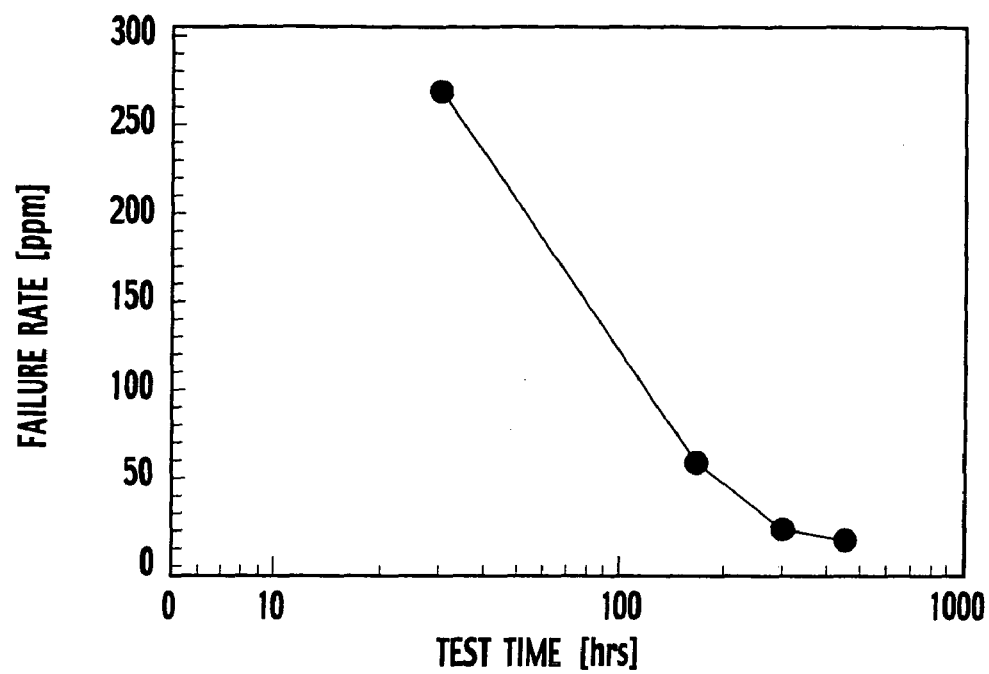
FIG. 4 is a graph showing the relationship between a failure rate and a test time after an acceleration test process is executed.

FIG. 4 is a graph in which failure rates to test times are plotted by executing the acceleration test process S100 before a package assembly process begins after the completion of a chip manufacturing process. In the acceleration test process, a test temperature is set to 225° C. As the test time elapses, the failure rate decreases. Accordingly, it can be determined that the failure of the Cu wiring due to stress migration is an initial failure and can be screened.

Figure 5:
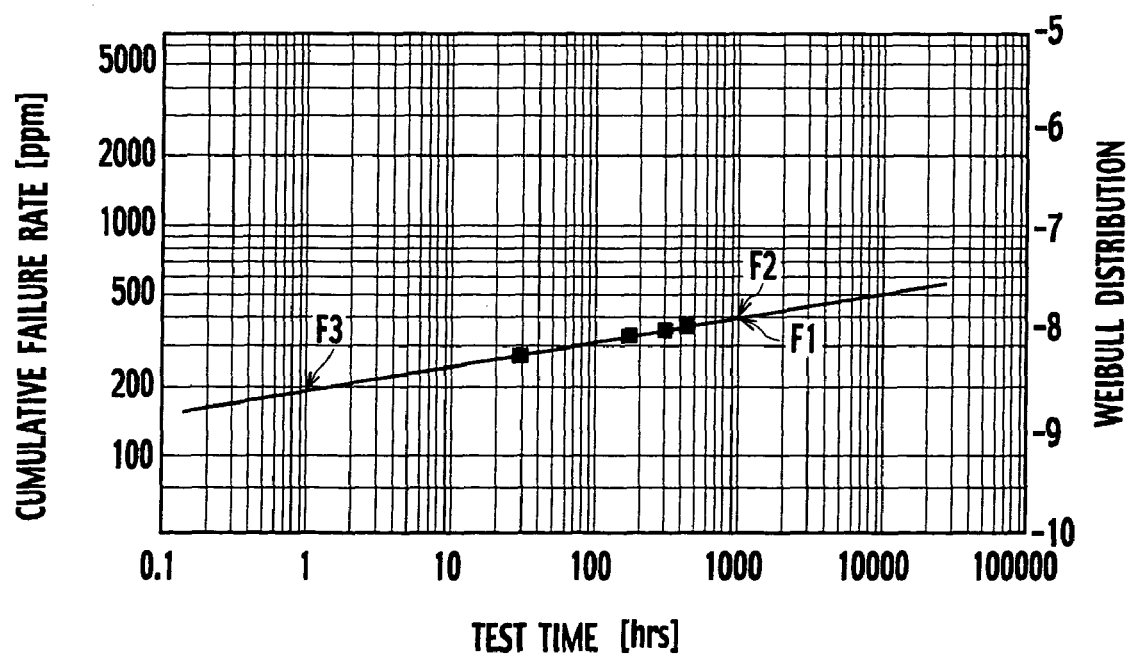
FIG. 5 is a graph showing the relationship between a cumulative failure rate and a test time after the acceleration test process shown in FIG. 4 is executed.

FIG. 5, as well as FIG. 4, is a graph in which cumulative failure rates to test times are plotted on a Weibull probability chart by executing the acceleration test process S100 before the package assembly process begins after the completion of the chip manufacturing process. In the acceleration test process, the test temperature is set to 225° C. When it is assumed that the ordinary operating temperature of semiconductor devices is 100° C., it can be found from FIG. 3 that a stress migration speed, which is accelerated 8.8 times compared to an ordinary stress migration speed, can be obtained at the test temperature of 225° C. Accordingly, when semiconductor devices are shipped without being subjected to the acceleration test process and ordinarily operated for one year, the cumulative failure rate of the semiconductor devices corresponds to the cumulative failure rate obtained in a test time of 985 hours (=24 hours×365 days/8.8). F1 in FIG. 5 shows the cumulative failure rate in the test time of 985 hours. The cumulative failure rate at F1 is 401.1 ppm. Further, F2 in FIG. 5 shows a cumulative failure rate in a test time of 986 hours. The cumulative failure rate at F2 is 401.2 ppm. Further, F3 in FIG. 5 shows a cumulative failure rate in a test time of one hour. The cumulative failure rate at F3 is 181.9 ppm. Accordingly, the cumulative failure rate of the semiconductor devices, which are shipped after they are subjected to the acceleration test process for one hour at 225° C. and then operated ordinarily for one year, corresponds to the difference between the cumulative failure rates of 986 hours (F2) and one hour (F3), that is, the cumulative failure rate is 219.3 ppm (=401.2−181.9).

Figure 6:
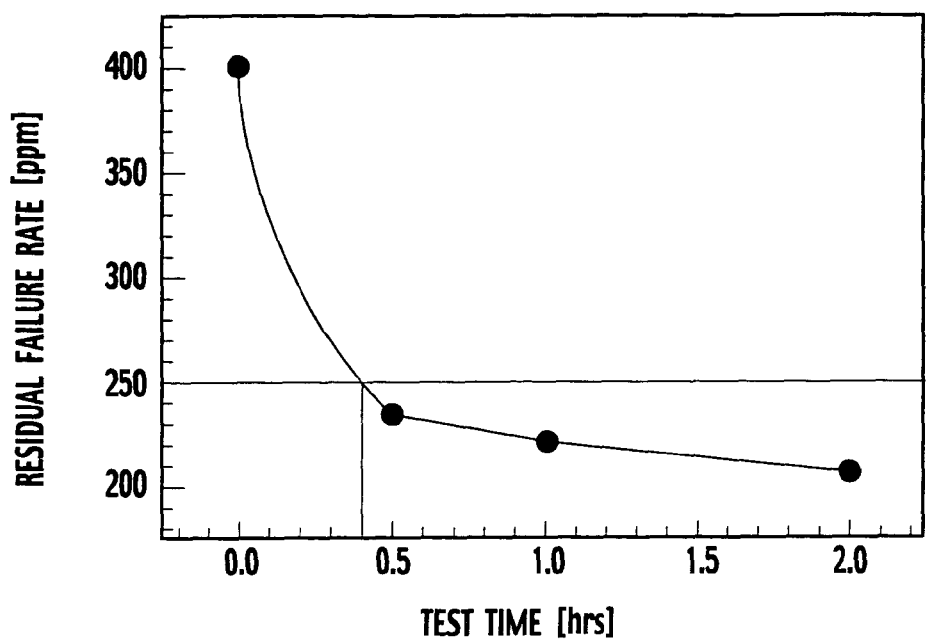
FIG. 6 is a graph showing the relationship between the test time during which the acceleration test process is executed and a residual failure rate.

FIG. 6 is a graph showing the relationship between the test time of the acceleration test process resulting from the acceleration test shown in FIGS. 4 and 5 and a residual failure rate caused by stress migration one year after the semiconductor devices are shipped. When the acceleration test process is not executed, the residual failure rate is about 400 ppm. The residual failure rate when the acceleration test process is not executed corresponds to the cumulative failure rate (401.1 ppm) in the 985 hours shown by F1 of FIG. 5. Further, the residual failure rate when the acceleration test process is executed for one hour corresponds to the difference between the cumulative failure rates of 986 hours (F2) and one hour (F3) shown in FIG. 5, that is, the cumulative failure rate is about 220 ppm. Further, as shown in FIG. 6, when the acceleration test process is executed for 0.4 hour, a predicted residual failure rate can be decreased to 250 ppm. The allowable residual failure rate of ordinary semiconductor devices for one year is 500 ppm after they are shipped. The residual failure rate of semiconductor devices due to migration is about half the allowable residual failure rate and very low. Further, a longer test time can further decreases the residual failure rate. However, a longer test time decreases the residual failure rate at a lower decreasing rate. Accordingly, the upper limit of the test time is determined in consideration of the productivity of semiconductor devices, and it is contemplated that the test time is two hours.

As described above, according to the semiconductor device testing method of the first embodiment, it is possible to eliminate the initial failure of Cu wiring caused by stress migration in semiconductor devices having Cu wiring by executing the acceleration test process S100 before the semiconductor devices are shipped, thereby it is possible to decrease the failure of semiconductor devices in the market.

Further, as shown in FIG. 6, the residual failure rate of the semiconductor devices due to migration can be held to 300 ppm or less within one year after they are shipped by executing the acceleration test process S100 for 0.4 hour or more.

An example of failure of Cu wiring due to stress migration, which may be caused in a semiconductor device after the semiconductor device testing method according to the first embodiment is executed, will be explained with reference to FIG. 7. Before the acceleration test process S100 is executed, a lower Cu wiring 12 is connected to an upper layer wiring 10 through a via contact 11 composed of copper similarly to the via contact chain shown in FIG. 2. However, avoid 13 is created in the portion, which is in contact with the via contact 11, of the main surface of the lower Cu wiring 12 by executing the acceleration test process S100 shown in FIG. 1. The creation of the void 13 may cause a failed connection between the lower Cu wiring 12 and the via contact 11.

Figure 7:
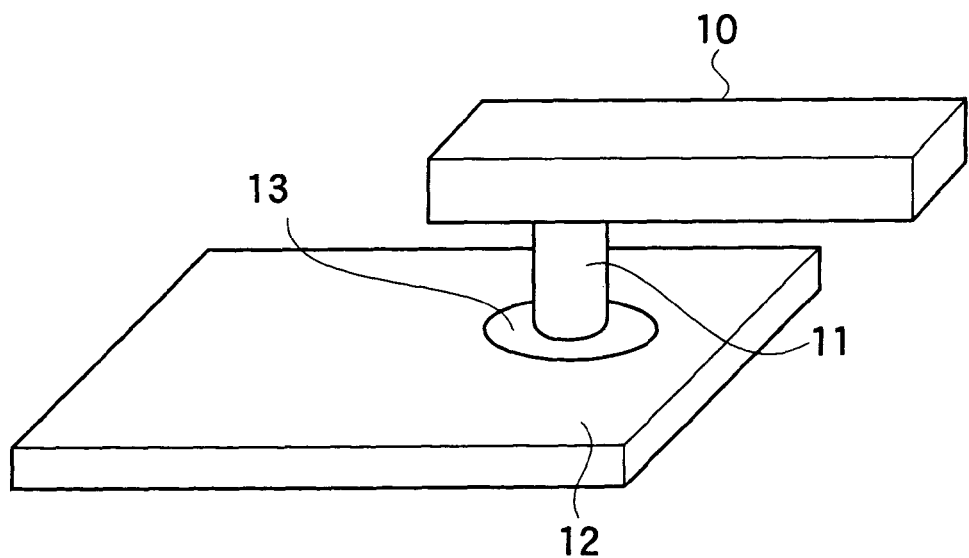
FIG. 7 is a perspective view of a via contact chain having a failed Cu wiring due to stress migration occurred when the semiconductor device testing method according to the first embodiment is executed.

It is contemplated that the failed connection shown in FIG. 7 is caused by the following mechanism. When the Cu wiring is formed, a diffusion prevention film is ordinarily formed on each of the Cu wiring to prevent the diffusion of copper. Further, when the via contact 11 is connected to the lower Cu wiring 12, the diffusion prevention film is selectively removed at a connecting portion, and the via contact 11 is connected to the opening of the diffusion prevention film. When the opening of the diffusion prevention film is formed using, for example, reactive ion etching (RIE) and the like, the lower Cu wiring 12 is damaged by the RIE at the opening portion. Further, local stress is increased in the lower Cu wiring 12 at the opening portion by a heat treatment executed to perform degassing after the opening of the diffusion prevention film and to reduce the oxides and the like on the surface of the lower Cu wiring 12. The failed connection is caused by the voids in the lower Cu wiring 12 which are created when a heat treatment such as annealing and the like is executed to grow the size of copper crystal particles in the Cu wiring and are concentrated in the lower Cu wiring 12 at the opening (on the bottom surface of the via contacts 11) by the above acceleration test. Accordingly, it is contemplated that the initial failure of the Cu wiring due to the stress migration as shown in FIG. 7 can be effectively eliminated using the semiconductor device testing method according to the first embodiment.

(Modification 1 of the First Embodiment)

Figure 8:
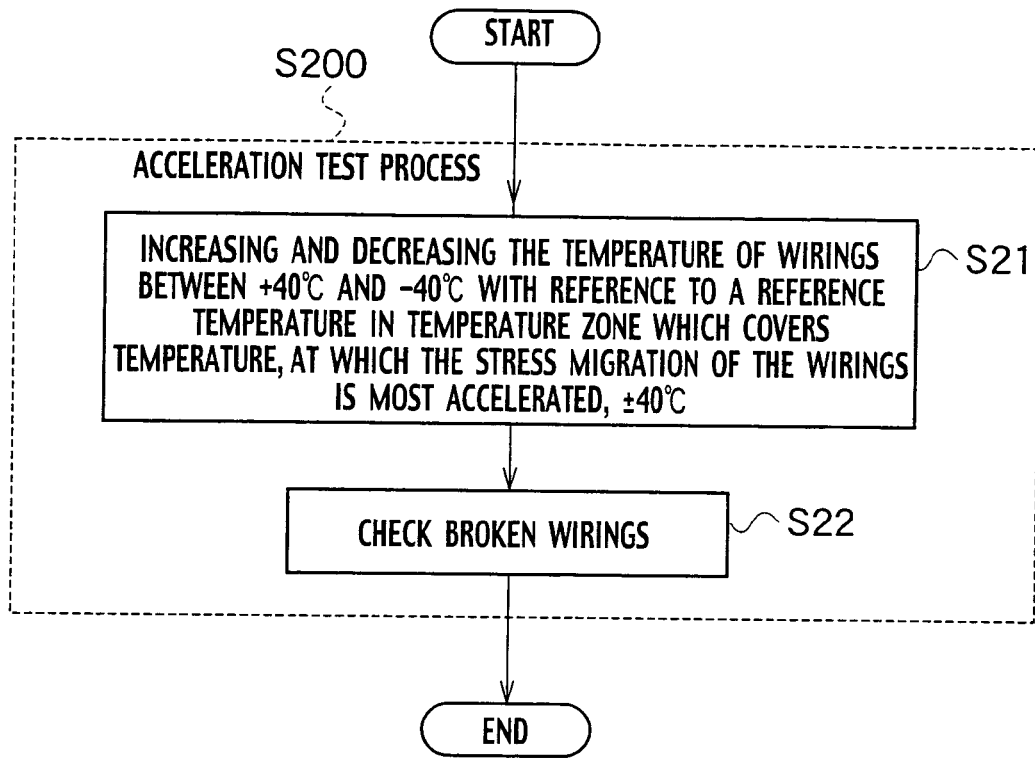
FIG. 8 is a flowchart of an acceleration test process S200 included in a semiconductor device testing method according to a modification 1 of the first embodiment.

The semiconductor device testing method according to the first embodiment may has an acceleration test process S200 in which a semiconductor device test temperature is increased and decreased as shown in FIG. 8 in place of the acceleration test process S100 shown in FIG. 1. As shown in FIG. 8, in the acceleration test process S200, at step S21, the semiconductor device test temperature is first increased and decreased, at least one or more times, in the range of ±40° C. with respect to a certain reference temperature in the temperature zone that covers the most accelerated temperature±40° C. Next, at step S22, whether or not Cu wiring are broken is checked. The acceleration test process S200 will be specifically explained below with reference to FIG. 9.

(a) At step S21, first, the semiconductor device test temperature is increased from a room temperature to a reference temperature 5 that is in a temperature zone 2 that covers the most accelerated temperature 1±40° C. The reference temperature 5 maybe any temperature included in the temperature zone 2 covering the the most accelerated temperature 1±40° C. Note that a temperature increasing speed and a temperature increasing method are not particularly limited, and semiconductor devices are heated by means similar to that of the ordinary high-temperature-holding test in the screening.

(b) Next, the semiconductor device test temperature is further increased to a temperature 6 that is 40° C. higher than the reference temperature 5. Thereafter, the semiconductor device test temperature is decreased to a temperature 7 that is 40° C. lower then the reference temperature 5. As described above, the semiconductor device test temperature is increased and decreased one or more times in a temperature zone 72 covering the reference temperature 5±40° C. During the above operation, no electrical or mechanical stress is applied to the semiconductor devices.

(c) Next, the semiconductor device test temperature is decreased to the room temperature. A temperature decreasing speed and a temperature decreasing method are not particularly limited, and the semiconductor devices are cooled by means similar to that of the ordinary high-temperature-holding test in the screening. It can be contemplated that the acceleration factor AF can be apparently increased by increasing and decreasing the test temperature as described above. This is because the void creation frequency of the term $(T_0-T_a)^n$ and the void growth speed of the term $\exp(-E_a/kT_a)$ of Expression 1 can be alternately increased.

(d) Finally, at step S22, a check is made to determine whether or not the Cu wiring, in which the time to failure due stress migration has been accelerated, are broken. The acceleration test process S200 is finished through the above procedure.

Figure 9:
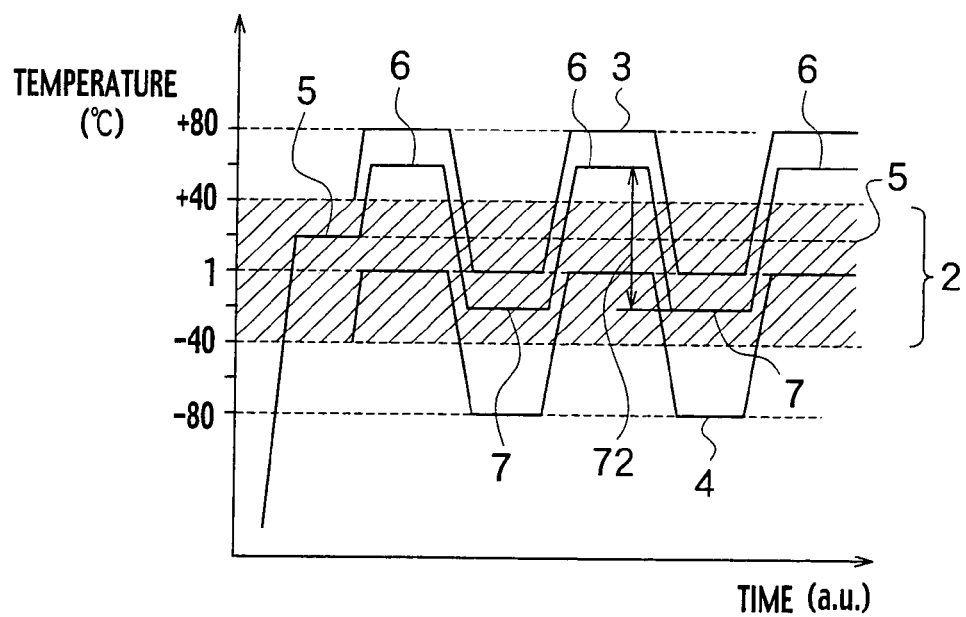
FIG. 9 is a graph exemplifying an increase and decrease of semiconductor device temperature at step S21 of FIG. 8.

Note that FIG. 9 shows a temperature cycle 3 in which the reference temperature 5 is set 40° C. higher than the most accelerated temperature 1 and a temperature cycle 4 in which the reference temperature 5 is set 40° C. lower than the most accelerated temperature 1. At step S21, the semiconductor device test temperature is increased and decreased one or more times between the temperature cycles 3 and 4.

According to the modification 1 of the first embodiment, it is possible to eliminate the initial failure of Cu wiring caused by stress migration in semiconductor devices having Cu wiring by executing the acceleration test process S200 before the semiconductor devices are shipped, similar to the first embodiment, thereby it is possible to decrease the number of failed semiconductor devices in the market.

(Modification 2 of the First Embodiment)

In a modification 2 of the first embodiment, timing at which the acceleration test processes S100 and S200 shown in FIGS. 1 and 8 are executed will be explained. The acceleration test processes S100 and S200 can be executed at some midpoint in a series of semiconductor device manufacturing processes.

Figure 10:
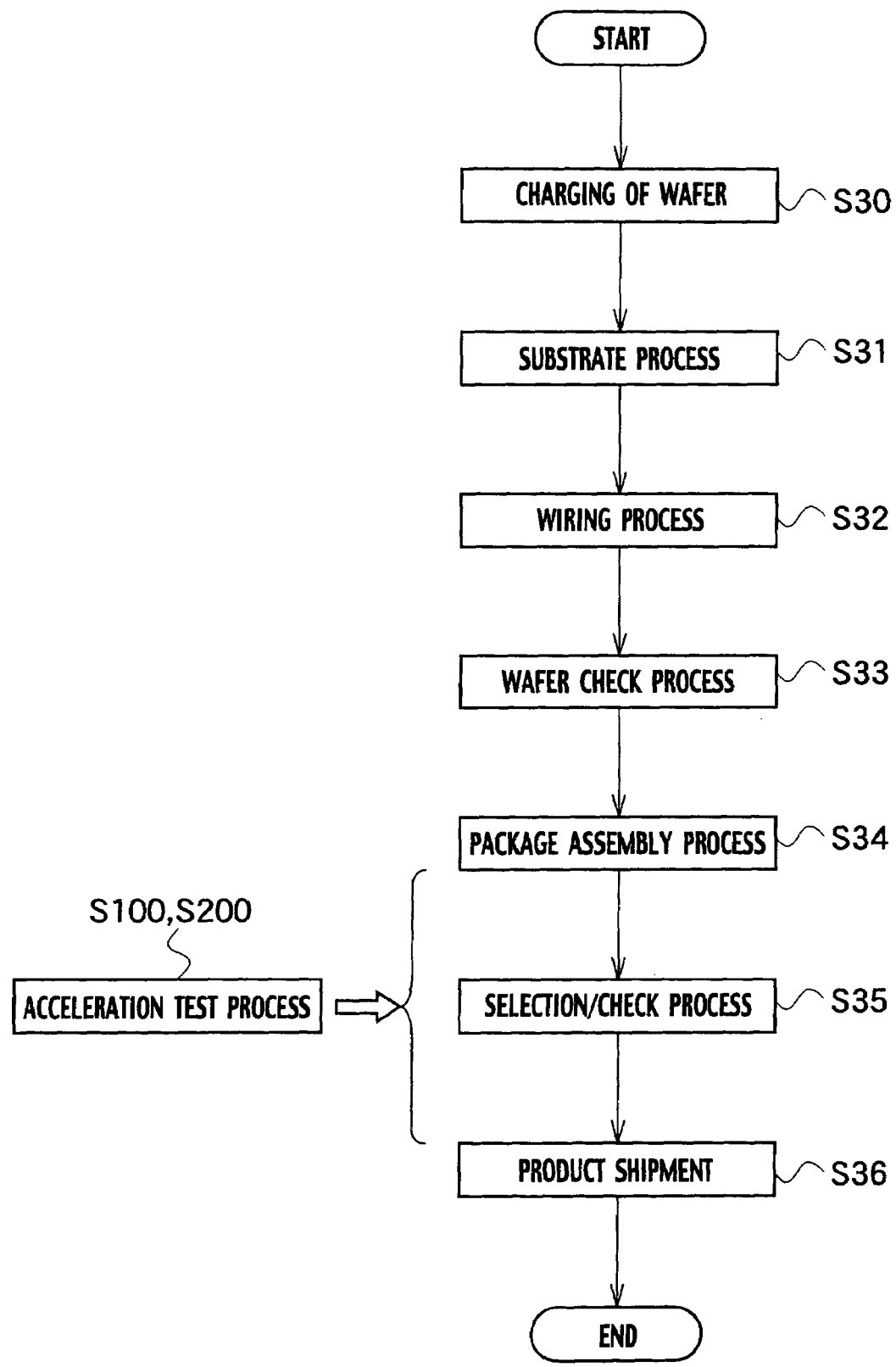
FIG. 10 is a flowchart of a semiconductor device manufacturing process according to a modification 2 of the first embodiment.

(a) As shown in FIG. 10, the series of semiconductor device manufacturing processes are started by charging a wafer at step S30. Thereafter, at step S31, a substrate process is executed. In the substrate process at step S31, device separation regions, well regions, and the like are formed to the upper portion of the wafer, electrode regions such as source/drain regions, and the like are formed in each of the device forming regions, and gate electrodes are formed on the wafer through a gate oxidation film. A plurality of semiconductor elements are formed on the wafer by a substrate process at step S31.

(b) A wiring process will be executed at step S32. In the wiring process at step S32, interlayer insulation films and Cu wiring are alternately formed on the wafer on which the plurality of semiconductor elements are formed, thereby a multi-layered wiring structure composed of a plurality of wiring layers is formed. The Cu wiring is connected to the semiconductor elements on the wafer. Further, the Cu wiring, which is formed on different wiring layers is connected to other wiring through via contacts formed in the interlayer insulation films. The plurality of semiconductor elements, which are connected to each other by the multilayer wiring structure, form a semiconductor integrated circuit. A wiring process will be described in detail in a second embodiment.

(c) Next, a wafer check process will be executed at step S33. In the wafer check process at step S33, a check is made whether or not each of the semiconductor chips in the semiconductor integrated circuit formed on the wafer operates normally, and a failed chip that does not operate normally is eliminated.

(d) Next, a package assembly process will be executed at step S34. The package assembly process S34 is started by dicing respective semiconductor chips from the wafer. Then, each semiconductor chip is die bonded to a lead frame, and the bonding pads of each semiconductor chip are lead bonded to lead pins. Thereafter, the semiconductor chip and the lead frame are molded by a mold resin using a predetermined metal mold, and a serial number, a manufacturer, and the like are printed on the surface of the mold resin. The package assembly process at step S34 is finished through the above procedure.

(e) Finally, the characteristics of the finished semiconductor devices are checked using an automatic IC tester and the like and failed semiconductor devices are selected in a selection/check process at step S35. Thereafter, the semiconductor devices are shipped as products in a product shipment process at step S36.

In the series of semiconductor device manufacturing processes described above, the acceleration test processes S100 and S200 shown in FIGS. 1 and 8 are executed before the products are shipped (step S36) after the completion of the package assembly process (step S34). Note that the acceleration test processes S100 and S200 may be executed at the final stage of the wiring process at step S32 or before the package assembly process S34 is executed after the completion of the chip wiring process (step S32). Further, it is also possible to execute the acceleration test processes S100 and S200 at some midpoint in the package assembly process (step S34). Further, the acceleration test processes S100 and S200 may be executed by a user of the semiconductor devices before they are assembled in a system after the devices have been received.

Second Embodiment

In a second embodiment, a semiconductor device manufacturing method including a step of executing the acceleration test process S100 shown in FIG. 1 will be described. It is needless to say that a step of executing the acceleration test process S200 can be included in the method likewise.

Figure 11:
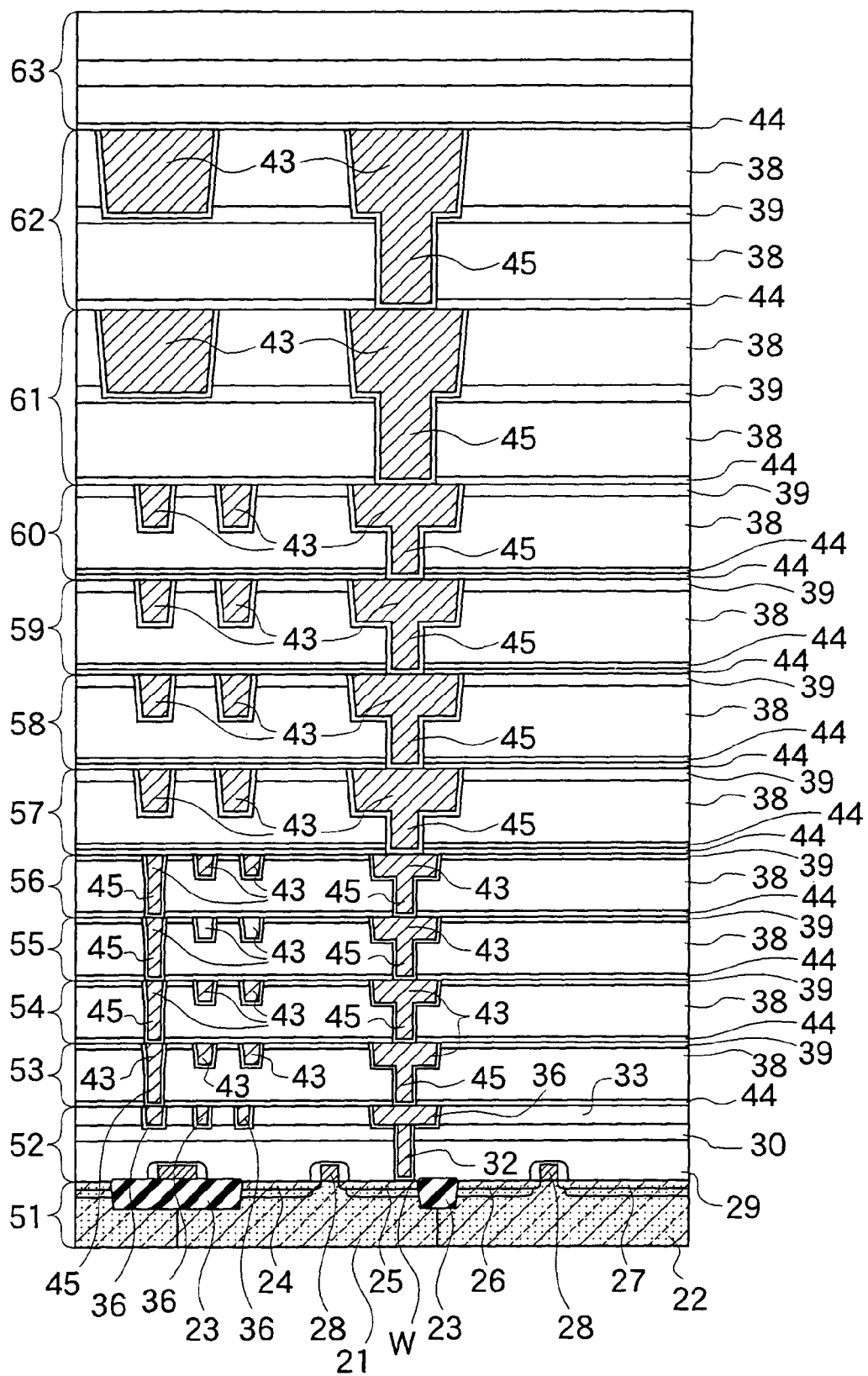
FIG. 11 is a sectional view of a semiconductor device having a multi-layered wiring structure according to a second embodiment.

As shown in FIG. 11, a semiconductor device according to the second embodiment has a multi-layered wiring structure in which first to eleventh wiring layers 52 to 62 are disposed on a semiconductor substrate 51 and a surface protection film 63 is disposed on the eleventh wiring layer 62. In the semiconductor substrate 51, a plurality of device forming regions are partitioned by device separation regions 23, and a plurality of MOS transistors each having source regions 24 and 26, drain regions 25 and 27, and gate electrodes 28 are disposed in each of the device forming regions. Each of the first to eleventh wiring layers 52 to 62 has interlayer insulation films 29, 30, 33, and 38 each formed of a plurality of layers, contacts 32 and 45, and Cu wiring 36 and 43. In the first wiring layer 52, a tungsten (W) contact 32 connected to the drain region 25 of a MOS transistor is disposed in the interlayer insulation films 29 and 30, and a Cu wiring 36 is disposed on the W contact 32. The Cu wiring 36 corresponds to the lower Cu wiring 12 of FIG. 2. In the second wiring layer 53, a via contact 45, which is composed of copper and connected to the Cu wiring 36, is disposed in an interlayer insulation film 38. A Cu wiring 43 is disposed on the via contact 45. The via contact 45 corresponds to the via contact 11 of FIG. 2. The Cu wiring 43 corresponds to the upper layer wiring 10 of FIG. 2 with respect to the Cu wiring 36 of the first wiring layer 52 and corresponds to the lower Cu wiring 12 of FIG. 2 with respect to the Cu wiring 43 of the third wiring layer 54. The third to eleventh wiring layers 54 to 62 have the same structure as that of the second wiring layer 53.

Figure 12:
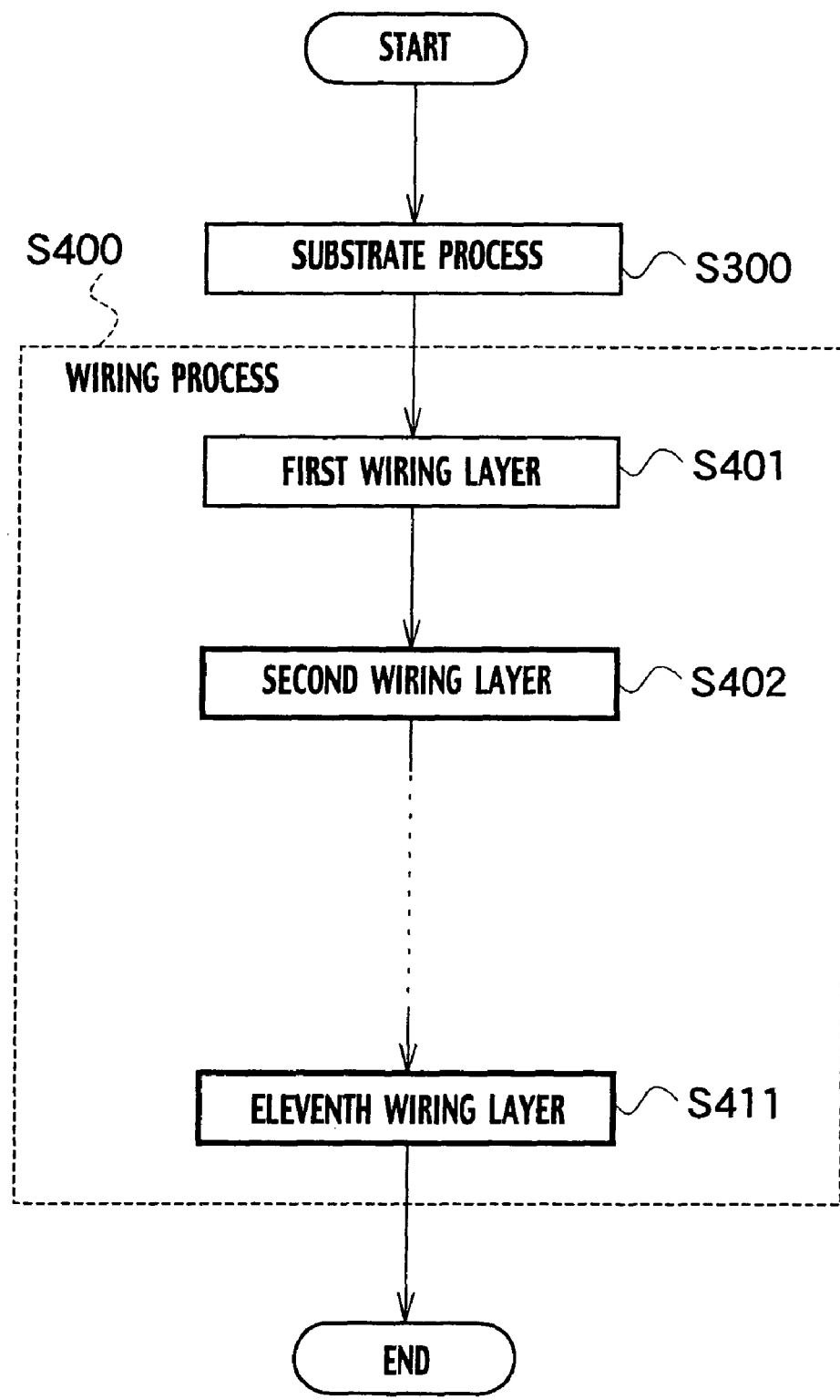
FIG. 12 is a flowchart of a semiconductor device manufacturing method according to the second embodiment.

Next, the semiconductor device manufacturing method according to the second embodiment will be explained. As shown in FIG. 12, the semiconductor device manufacturing method according the second embodiment has a substrate process S300 and a wiring process S400.

(a) First, the substrate process S300 is executed. The substrate process S300 corresponds to the substrate process executed at step S31 in FIG. 10. Specifically, as shown in FIG. 15, device separation regions 23 composed of an insulation material and a gate oxide film 9 are formed in the upper portion of a semiconductor substrate. A p-well 21 is formed in the region which is surrounded by the device separation regions 23 and in which an n-type MOS transistor is formed, and an n-well 22 is formed in the region in which a p-type MOS transistor is formed. Then, first gate electrodes 28a are formed on the gate oxide film 9. First source regions 24b and 26b and first drain regions 25b and 27b are formed by doping n-type/p-type impurities in the semiconductor substrate using the first gate electrodes 28a and the device separation regions 23 as masks. Insulation films (sidewalls) 8 facing the sidewalls of the first gate electrodes 28a are formed, and second source regions 24a and 26a and second drain regions 25a and 27a are formed using the side walls 8 as masks. Finally, second gate electrodes 28b each composed of a silicide film is formed. The substrate process S300 is finished through the above procedure.

Figure 13:
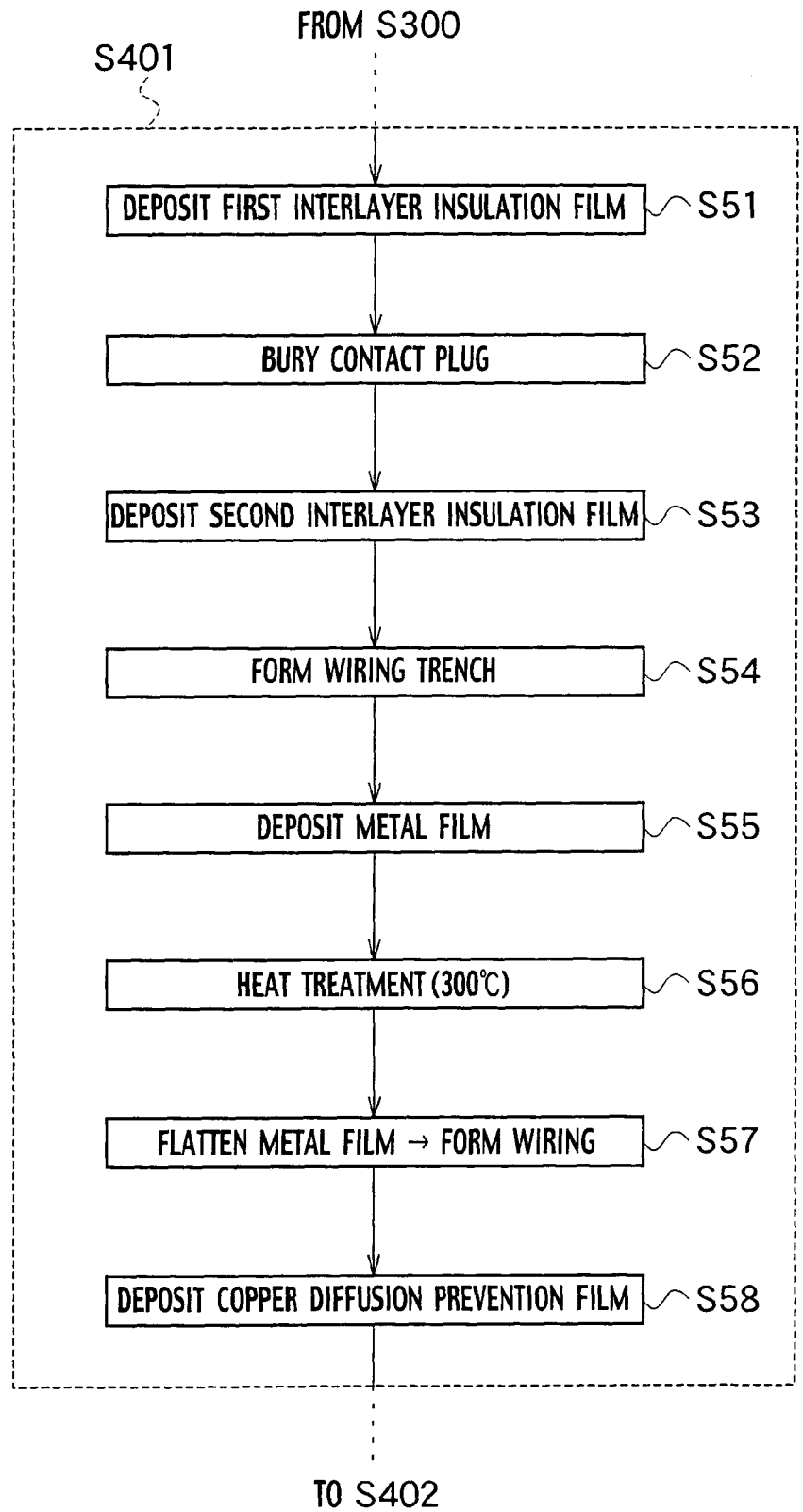
FIG. 13 is a flowchart of the steps included in a manufacturing process S401 for a first wiring layer of FIG. 12.
Figure 15A:
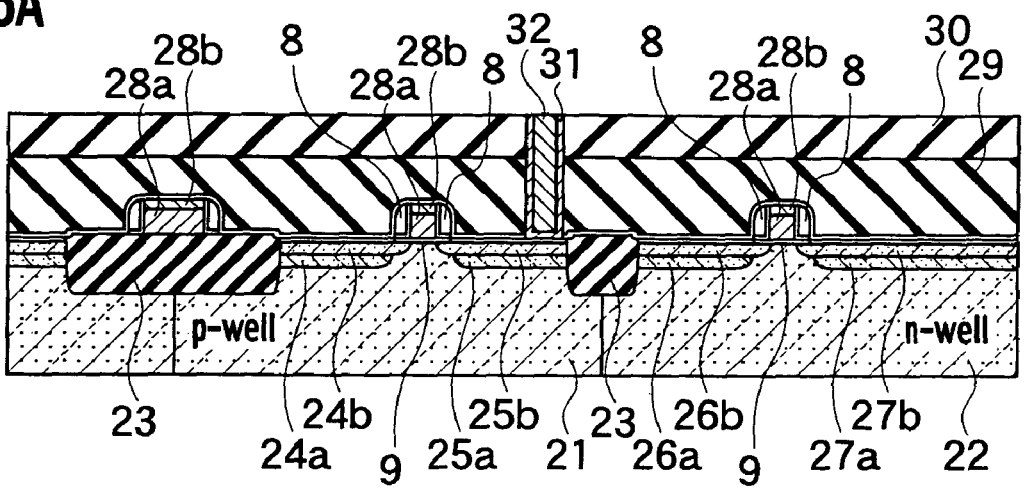
FIGS. 15A to 15G are process sectional views showing main manufacturing processes in the semiconductor device manufacturing method according to the second embodiment.

(b) Next, the wiring process S400 having first to eleventh wiring layer manufacturing subprocesses S401 to S411 will be executed. As shown in FIG. 13, the first wiring layer manufacturing subprocess S401 has steps S51 to S58. First, at step S51, the first interlayer insulation films 29 and 30 are formed on the semiconductor substrate as shown in FIG. 15A. The first interlayer insulation film 29 is composed of a silicon oxide film ($SiO_2$ film) deposited using chemical vapor deposition (CVD) and containing phosphorous or boron. Then, the first interlayer insulation film 30 is flattened using chemical mechanical polishing (CMP).

(c) Next, a contact hole is formed by selectively etching the first interlayer insulation films 29 and 30. The first drain region 25b is exposed to the bottom of the contact hole. Then, at step S52, contact plugs 31 and 32 are buried in the contact hole.

Figure 15B:
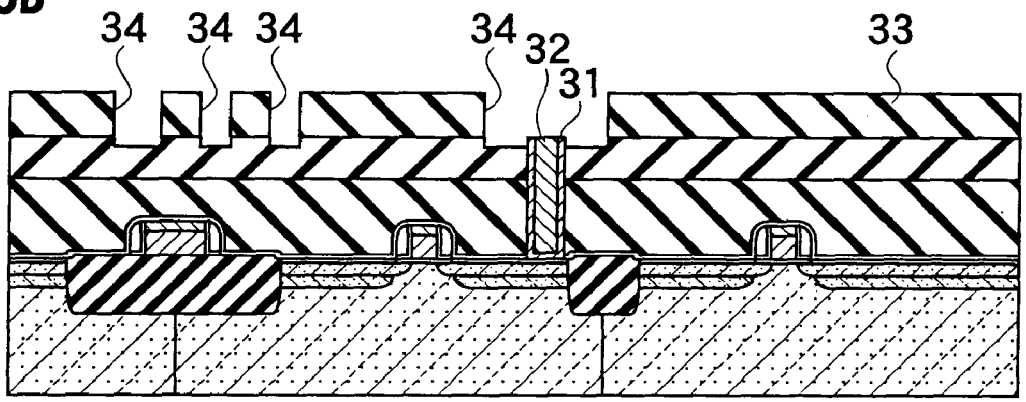
Figure 15C:
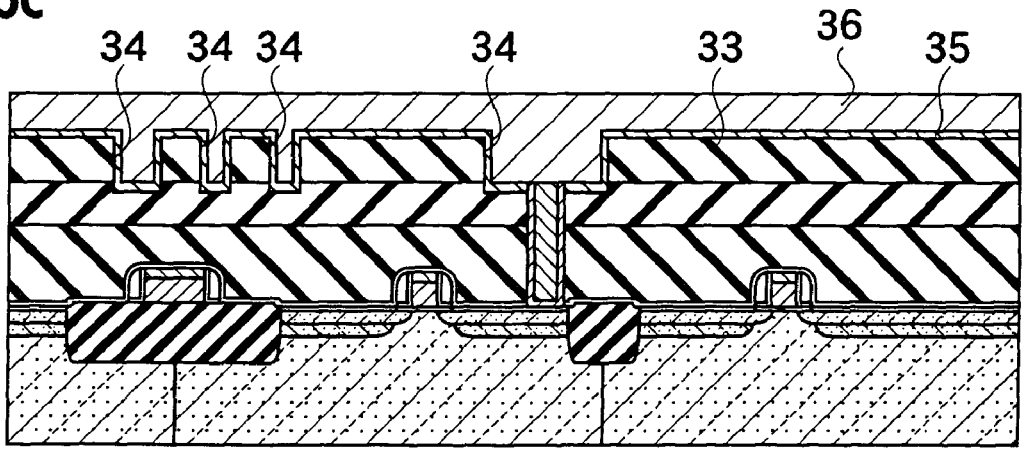

(d) Next, at step S53, the second interlayer insulation film 33 is deposited as shown in FIG. 15B. Next, at step S54, wiring trenches 34 are formed by selectively etching the second interlayer insulation film 33 using RIE. The contact plugs 31 and 32 are exposed to the bottoms of the wiring trenches 34.

(e) Next, at step S55, a barrier metal 35 composed of tantalum or an alloy containing tantalum and a metal film (hereinafter, referred to as "copper metal film") 36 composed of copper or an alloy mainly composed of copper are deposited by PVD or CVD. The barrier metal 35 and the copper metal film 36 are also deposited in the wiring trenches 34. Note that the copper metal film 36 may be formed by PVD, CVD, electrolytic plating, and non-electrolytic plating.

(f) Next, at step S56, a heat treatment is executed to grow the size of copper particles. The heat treatment is executed preferably at 300° C. to improve the reliability of the Cu wiring 36.

Figure 15D:
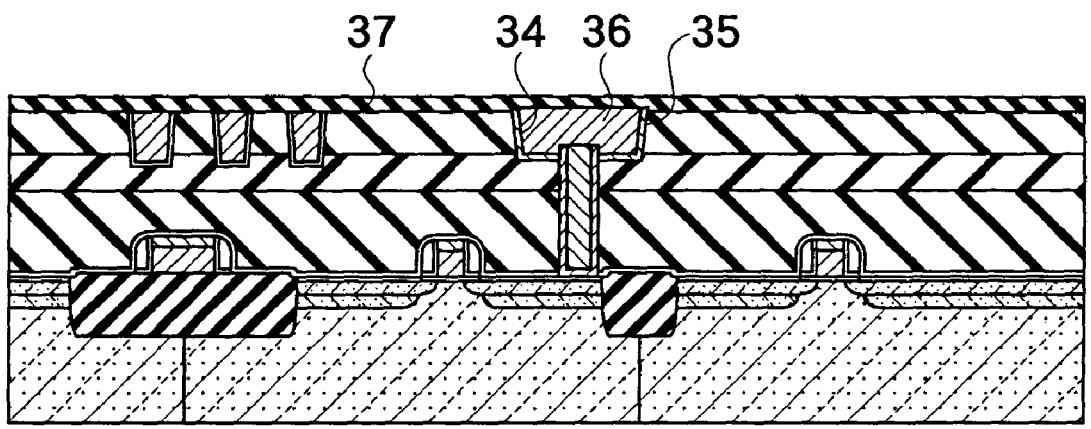

(g) Next, at step S57, the barrier metal 35 and the copper metal film 36 are flattened using CMP. As shown in FIG. 15D, a first wiring 36, which is composed of the barrier metal 35 and the copper metal film 36 each buried in the wiring trench 34, is formed. Next, at step S58, a diffusion prevention film 37 composed of a silicon nitride film ($Si_3N_4$ film) and the like is formed. The diffusion prevention film 37 is a firm for preventing the diffusion of copper. The first wiring layer manufacturing subprocess S401 shown in FIG. 13 is finished through the above procedure.

Figure 14:
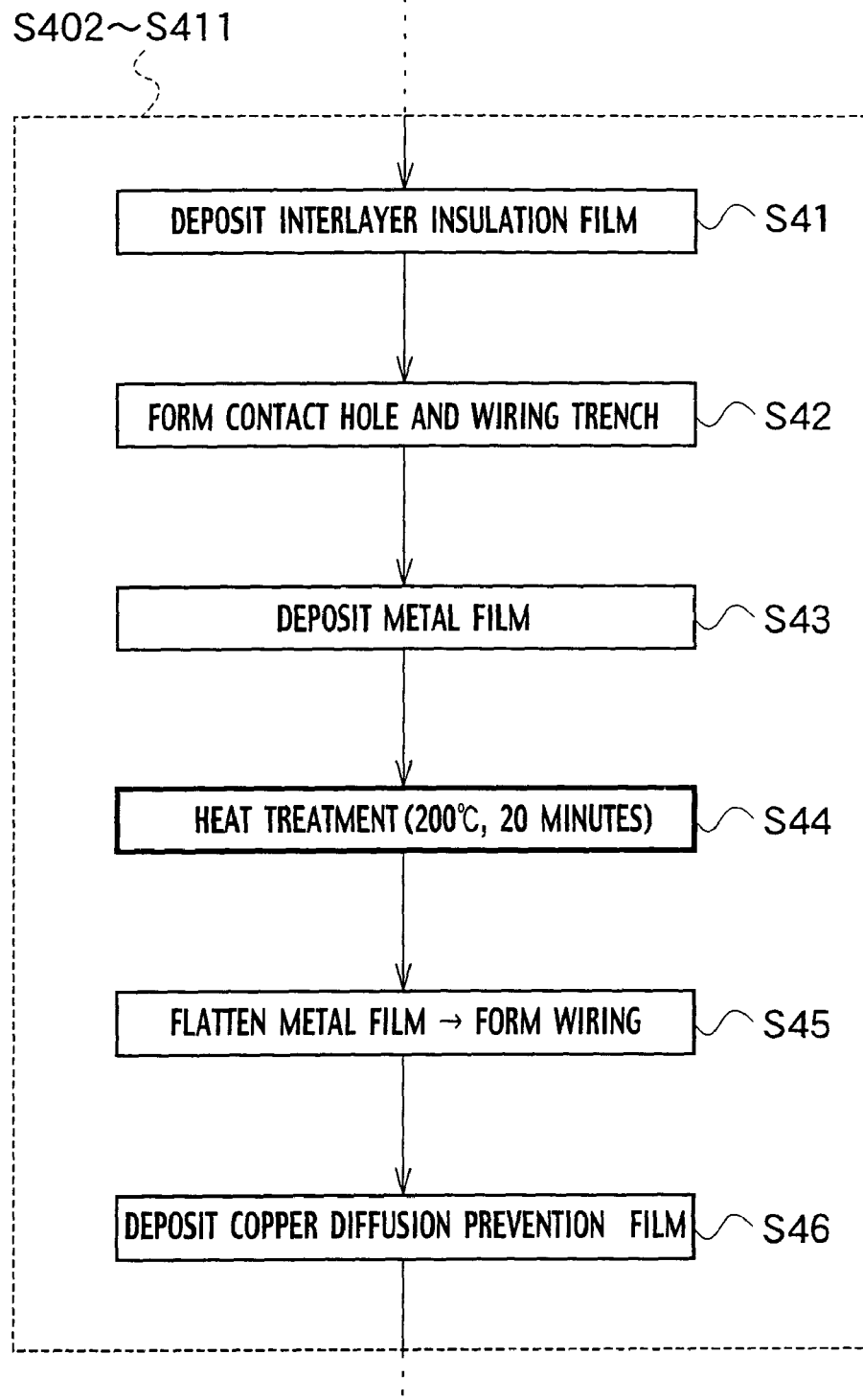
FIG. 14 is a flowchart of the steps included in manufacturing processes S402 to S411 for second to eleventh wiring layers of FIG. 12.
Figure 15E:
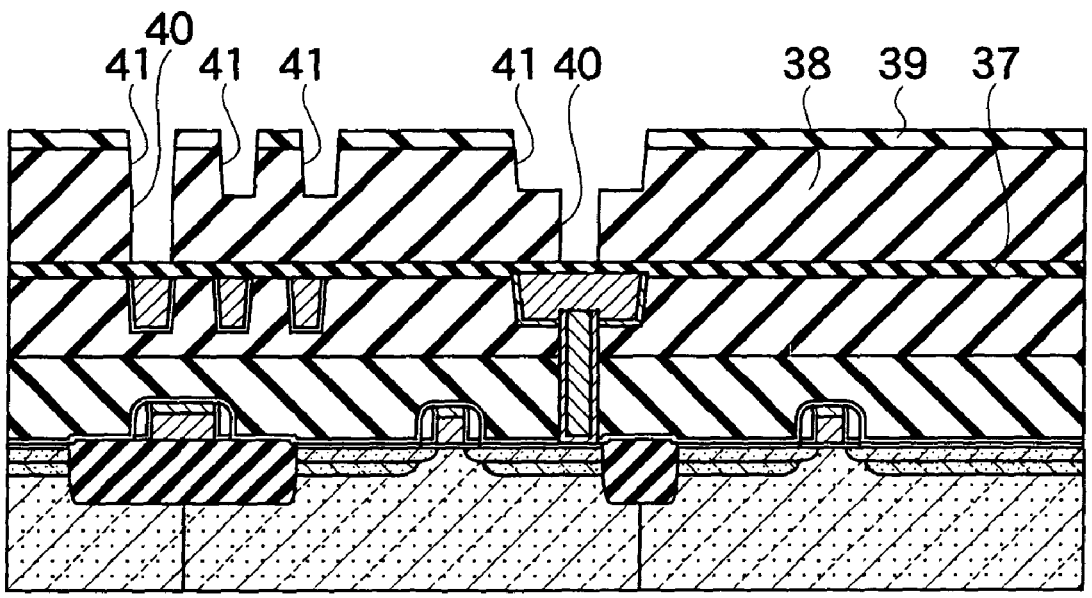

(h) Next, the manufacturing subprocess S402 of the second wiring layer 53 shown in FIG. 12 is executed. As shown in FIG. 14, the manufacturing subprocess S402 of the second wiring layer has steps S41 to S46. First, at step S41 as shown in FIG. 15E, interlayer insulation films 38 and 39 are deposited on the diffusion prevention film 37 by CVD. Next, at step S42, a contact hole 40 and a wiring trench 41 are formed using photolithography and RIE. The diffusion prevention film 37 is exposed to the bottom of the contact hole 40.

Figure 15F:
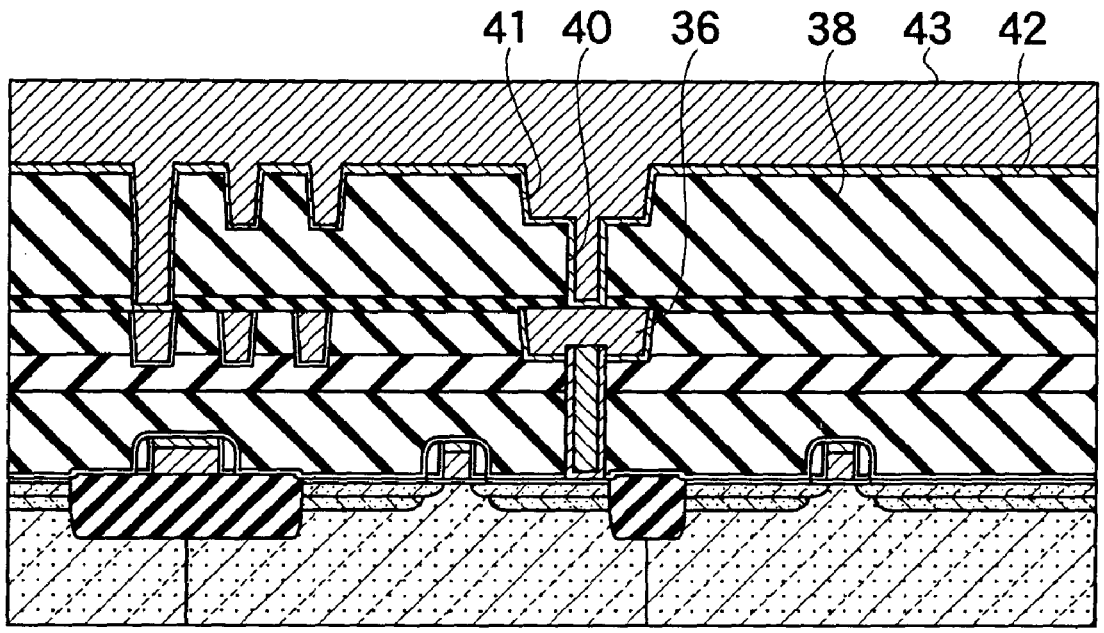

(i) Next, the copper metal film 36 is partly exposed by selectively removing the diffusion prevention film 37 exposed to the bottom of the contact hole 40. A wet treatment or a heat treatment is executed to clean the exposed copper metal film 36. Then, at step S43, a via metal 42 composed of tantalum or an alloy containing tantalum and a Cu metal film 43 are deposited by PVD, CVD, electrolytic plating, or non-electrolytic plating as shown in FIG. 15F. The via metal 42 and the Cu metal film 43 are also deposited in the contact hole 40 and in the wiring trench 34. Accordingly, the via metal 42 is connected to the copper metal film 36 of the first wiring layer 52 at the bottom of the contact hole 40.

(j) Next, at step S44, the semiconductor device is subjected to a heat treatment at a test temperature in the temperature zone of 150° C. to 230° C. In this heat treatment, the copper metal film 36 of the first wiring layer 52 can be screened differently from step S56 (heat treatment) of FIG. 13. Accordingly, at step S44, the Cu wiring in a manufacturing process is held in the temperature zone covering the most accelerated temperature 190° C.±40° C. for 20 minutes. The Cu wiring in the manufacturing process can be prevented from being oxidized by executing the heat treatment in a nitride atmosphere. Note that the heat treatment is executed at a test temperature of 200° C.

Figure 15G:
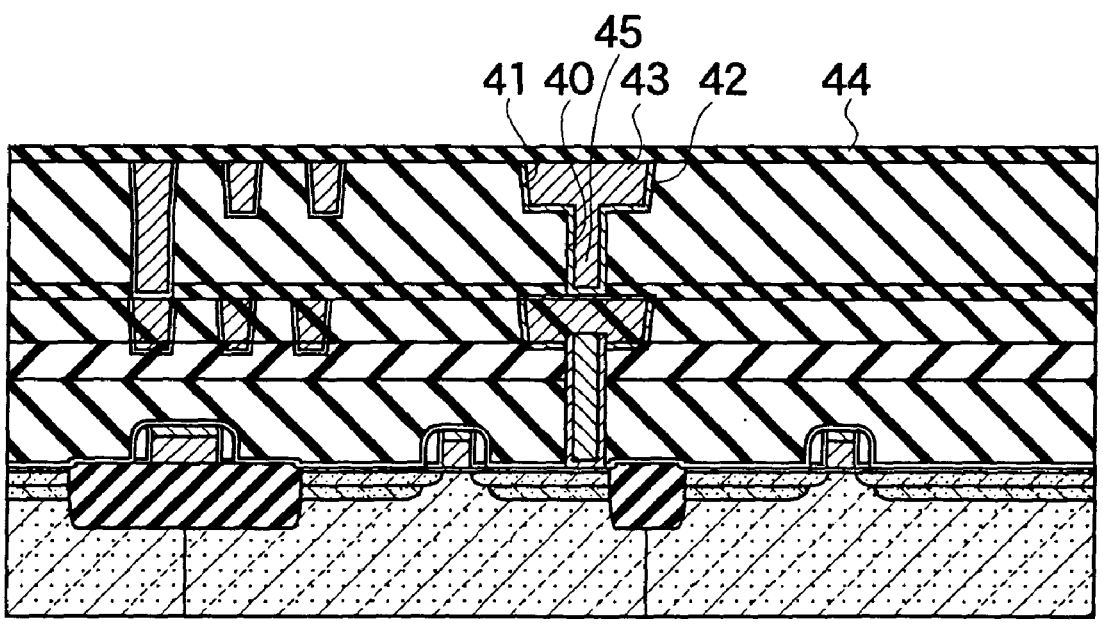

(k) Next, at step S45, the barrier metal 42 and the Cu metal film 43 are flattened using CMP. As shown in FIG. 15G, the via metal 42 and the Cu metal film 43, which are buried in the contact hole 40 and the wiring trench 41, and the via contact 45 are formed. Next, at step S46, a diffusion prevention film 44 composed of a silicon nitride film ($Si_3N_4$ film) and the like is formed. The manufacturing subprocess S402 of the second wiring layer 53 shown in FIG. 14 is finished through the above procedure.

(l) Thereafter, the third to eleventh wiring layers 54 to 62 are formed by repeating the same procedure as that of the second wiring layer manufacturing subprocess shown in FIG. 14, and the surface protection film 63 is formed on the eleventh wiring layer 62. The semiconductor device shown in FIG. 11 can be manufactured through the above processes.

The Cu wiring of the first to tenth wiring layers 52 to 61, which have been formed, can be screened by executing the heat treatment (at 200° C. for 20 minutes) at step 44 of FIG. 14 in the respective manufacturing processes of the second to eleventh wiring layers 53 to 62. That is, the acceleration test of the stress migration of the Cu wiring in the respective wiring layers can be executed by employing a heat treatment corresponding to step S11 of FIG. 1 in the manufacturing process of the respective wiring layers. With this operation, the Cu metal film 36 of, for example, the first wiring layer 51 is subjected to the heat treatment at 200° C. for a total of 200 minutes (=200 minutes by 10 times). Accordingly, screening can be sufficiently executed to eliminate the initial failure of the Cu wiring due to stress migration from the relationship between the test time and the residual failure rate shown in FIG. 6.

Note that a similar screening effect can be obtained even if the wafer is subjected to the heat treatment in, for example, an inert gas atmosphere of argon, etc., in a vacuum atmosphere, in hydrogen, a mixed gas of hydrogen and nitrogen, ammonia, etc. and in a reducing atmosphere containing these gases, in addition to the nitrogen atmosphere.

Further, as shown in FIG. 14, in the second embodiment, after the via metal 42 and the Cu metal films 43 are deposited (step S43), the heat treatment (step S44) is executed to accelerate the stress migration of the Cu wiring before the Cu wiring are formed (step S45) by flattening the via metal 42 and the Cu metal films 43. However, the present invention is not limited thereto. That is, the Cu wiring may be subjected to the heat treatment (step S44) after the Cu wiring are formed (step S45) by flattening the Cu metal film 43. Further, the heat treatment (step S44) may be executed after the diffusion prevention film is deposited (S46).

As described above, a semiconductor device testing method and a semiconductor device manufacturing method can be provided which is capable of reducing failed Cu wiring in the market.

Various modifications will become possible for those skilled in the art after receiving the teaching of the present disclosure without departing from the scope thereof.

What is claimed is:

1. A testing method for a semiconductor device, having wirings composed of copper or an alloy mainly composed of copper, comprising:

executing an acceleration test for eliminating an initial failure of the wirings due to stress migration, wherein executing the acceleration test comprises holding a temperature of the semiconductor device in a first temperature zone covering ±40° C. of a temperature at which the stress migration is most accelerated, the temperature at which the stress migration is most accelerated is a test temperature when an acceleration factor AF is maximized, the acceleration factor AF is obtained based on a time to failure at a maximum temperature in actual use of the semiconductor device and a time to failure at the test temperature of the semiconductor device; and checking whether or not the wirings are broken.

2. The testing method of a semiconductor device as in claim 1, wherein the acceleration factor AF has a relationship shown by following Expression $$AF=\{C(TO-Ta)^{-n} \cdot \exp(Ea/kTa)\}/\{C(TO-Ta\text{test})^{-n} \cdot \exp(Ea/kTa\text{test})\}$$

where, Ta is the maximum temperature, Tatest is the test temperature, C and n are constants inherent to the semiconductor device, TO is a stress free temperature, Ea is activation energy of growth of voids in the wirings, and k is the Boltzmann constant.

3. The testing method as in claim 1, wherein executing the acceleration test comprises holding the temperature of the semiconductor device in the first temperature zone for at least 0.4 hour.

4. The testing method as in claim 1, wherein executing the acceleration test comprises holding the temperature of the semiconductor device in the first temperature zone from 0.4 hour to two hours.

5. The testing method as in claim 1, wherein executing the acceleration test comprises increasing and decreasing the temperature of the semiconductor device at least once in a second temperature zone covering ±40° C. of a reference temperature set in the first temperature zone covering ±40° C. of a temperature at which the stress migration is most accelerated.

6. The testing method as in claim 5, wherein executing the acceleration test comprises increasing and decreasing the temperature of the semiconductor device in the second temperature zone for at least 0.4 hour.

7. The testing method as in claim 5, wherein executing the acceleration test comprises increasing and decreasing the temperature of the semiconductor device in the second temperature zone from 0.4 hour to two hours.

8. The testing method as in claim 1, wherein after semiconductor elements composing the semiconductor device are formed on a semiconductor substrate, executing the acceleration test when the wirings are formed in wiring layers through interlayer insulation films and the semiconductor elements are connected to each other via the wirings.

* * * * *